US012721027B2

(12) United States Patent
Forrest et al.

(10) Patent No.: US 12,721,027 B2
(45) Date of Patent: Aug. 25, 2026

(54) LARGE AREA ORGANIC PHOTOVOLTAICS

(71) Applicant: The Regents of the University of Michigan, Ann Arbor, MI (US)

(72) Inventors: Stephen R. Forrest, Ann Arbor, MI (US); Nana Wang, Ann Arbor, MI (US); Jeramy Zimmerman, Golden, CO (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/410,670

(22) PCT Filed: Jun. 24, 2013

(86) PCT No.: PCT/US2013/047287
§ 371 (c)(1),
(2) Date: Dec. 23, 2014

(87) PCT Pub. No.: WO2014/004364
PCT Pub. Date: Jan. 3, 2014

(65) Prior Publication Data

US 2015/0325792 A1 Nov. 12, 2015

Related U.S. Application Data

(60) Provisional application No. 61/664,058, filed on Jun. 25, 2012.

(51) Int. Cl.
*H10K 77/10* (2023.01)
*B82Y 10/00* (2011.01)
(Continued)

(52) U.S. Cl.
CPC .............. *H10K 77/10* (2023.02); *B82Y 10/00* (2013.01); *H10K 30/81* (2023.02); *H10K 71/00* (2023.02);
(Continued)

(58) Field of Classification Search
CPC ........................ H01L 51/0002; H01L 51/0096
See application file for complete search history.

(56) References Cited

U.S. PATENT DOCUMENTS

2003/0172954 A1* 9/2003 Verhaverbeke ........... B08B 3/12 134/1.3
2004/0043601 A1* 3/2004 Park .................. H01L 21/28518 438/629

(Continued)

FOREIGN PATENT DOCUMENTS

CN 101088179 A 12/2007
CN 102177599 A 9/2011

(Continued)

OTHER PUBLICATIONS

Jun-Jian, Li. et al., "Cleaning of ITO glass with carbon dioxide snow jet spray," Proceedings of SPIE, vol. 6722, Nov. 14, 2007, pp. 672241-672241-6.

(Continued)

*Primary Examiner* — Nathan T Leong
(74) *Attorney, Agent, or Firm* — Finnegan, Henderson, Farabow, Garrett & Dunner, LLP

(57) ABSTRACT

Disclosed herein are large area, multi-layer solar devices comprising a substrate, an active area comprising at least one donor material and at least one acceptor material deposited on a surface of the substrate, wherein the donor and acceptor materials are comprised of organic molecules, and wherein particulates are removed from the surface of the substrate before deposition of the donor and acceptor materials. Particulates may be removed by exposing the surface of the substrate to a stream of at least one compound comprising one or more phases chosen from supercritical, gaseous, solid, and liquid phases. Also disclosed are methods of manufacturing photovoltaic devices comprising providing a substrate, cleaning a surface of the substrate by
(Continued)

exposing the surface to a stream of at least one compound comprising one or more phases chosen from supercritical, gaseous, solid, and liquid phases, and depositing an organic active layer on the surface of the substrate.

11 Claims, 9 Drawing Sheets

(51) Int. Cl.
*H10K 30/81* (2023.01)
*H10K 71/00* (2023.01)
*H10K 71/10* (2023.01)
*H10K 30/20* (2023.01)
*H10K 30/50* (2023.01)
*H10K 85/20* (2023.01)
*H10K 102/00* (2023.01)

(52) U.S. Cl.
CPC ............. *H10K 71/10* (2023.02); *H10K 30/20* (2023.02); *H10K 30/50* (2023.02); *H10K 85/211* (2023.02); *H10K 2102/00* (2023.02); *Y02E 10/549* (2013.01); *Y02P 70/50* (2015.11)

(56) References Cited

U.S. PATENT DOCUMENTS

| | | | | |
|---|---|---|---|---|
| 2005/0191861 | A1 | 9/2005 | Verhaverbeke | |
| 2006/0027801 | A1 | 2/2006 | Forrest et al. | |
| 2006/0027802 | A1* | 2/2006 | Forrest | B82Y 10/00 257/40 |
| 2006/0254612 | A1 | 11/2006 | Farrar | |
| 2007/0081886 | A1* | 4/2007 | Myoung | H01L 21/67772 414/806 |
| 2007/0111519 | A1* | 5/2007 | Lubomirsky | C23C 18/1653 438/678 |
| 2008/0271991 | A1 | 11/2008 | Korzenski et al. | |
| 2010/0084011 | A1* | 4/2010 | Forrest | B82Y 10/00 136/255 |
| 2013/0069042 | A1 | 3/2013 | Matsuura et al. | |

FOREIGN PATENT DOCUMENTS

| | | | |
|---|---|---|---|
| JP | 1993217673 | A | 8/1993 |
| JP | 2003209088 | A | 7/2003 |
| JP | 2006147654 | A | 6/2006 |
| JP | 2011205075 | A | 10/2011 |
| JP | 2012119525 | A | 6/2012 |
| TW | 200726858 | A | 7/2007 |
| TW | 200727348 | A | 7/2007 |
| WO | WO 2011/152091 | | 12/2011 |

OTHER PUBLICATIONS

Jun-Jian, Li. et al. "ITO glass polishing using carbon dioxide snow jet technique for organic light-emitting diodes," Proceedings of SPIE, vol. 7282, May 11, 2009, pp. 72822K-72822K-4.

International Search Report and Written Opinion issued in copending PCT Application No. PCT/US2013/047287, dated Oct. 17, 2013, 10 pages.

English translation of Search Report issued in Chinese Patent Application No. 201380039813.5, dated Sep. 2, 2016.

Kim, Jinhyun, et al., *Influence of Surface Morphology Evolution of SubPc Layers on the Performance of SubPc/C60 Organic Photovoltaic Cells*, Appl. Phys. Lett., vol. 99, pp. 193303-1 to 193303-3 (Nov. 8, 2011).

Xiong Chucai, *CO2 Snow Cleaning Technology*, Cleaning Technology, vol. 2, Issue 10, pp. 64-70 (Oct. 31, 2004).

Choi et al., "Area-scaling of organic solar cells," J. Appl. Phys., vol. 106, pp. 054507-1 to 054507-10 (Sep. 4, 2009).

Gupta et al., "Area dependent efficiency of organic solar cells," Appl. Phys. Lett., vol. 93, pp. 163301-1 to 163301-3 (2008).

Park et al., "Large-area organic solar cells with metal subelectrode on indium tin oxide anode," Appl. Phys. Lett., vol. 96, pp. 173301-1 to 173301-3 (Apr. 26, 2010).

Wang et al., "Snow cleaning of substrates increases yield of large-area organic photovoltaics," Appl. Phys. Lett., vol. 101, pp. 133901-1 to 133901-4 (Sep. 25, 2012).

* cited by examiner

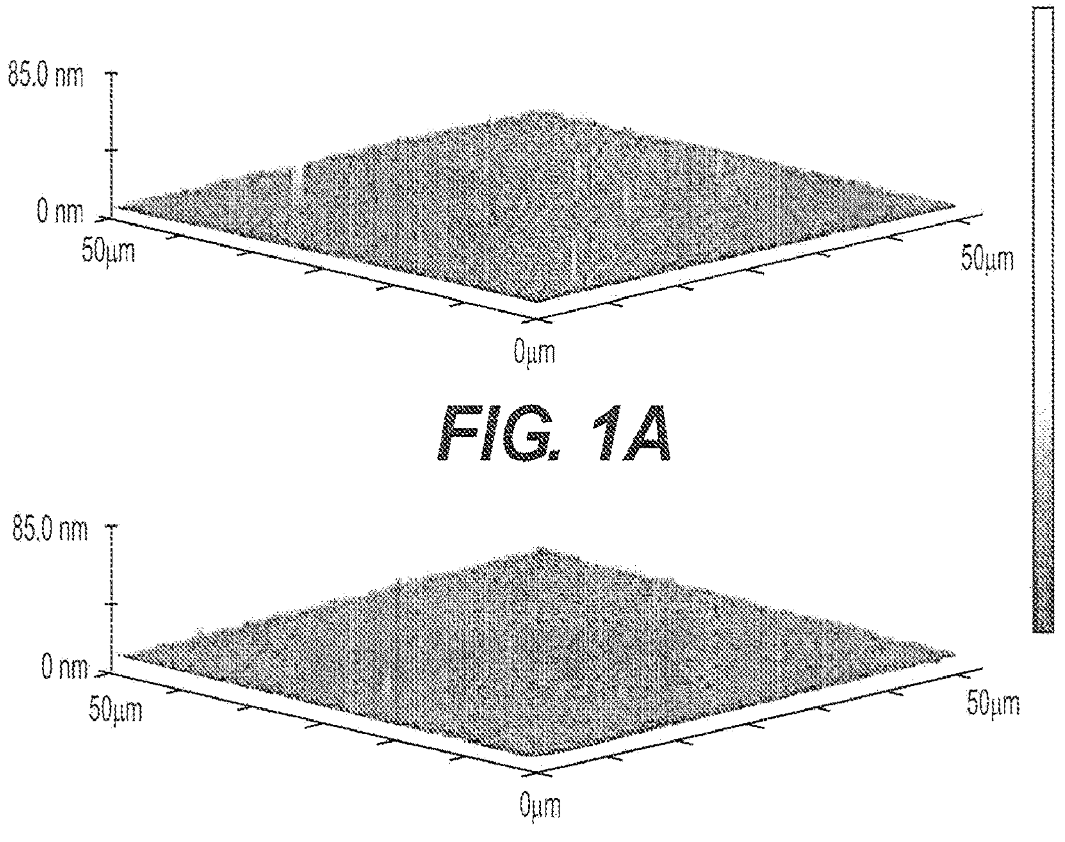
FIG. 1A
FIG. 1B
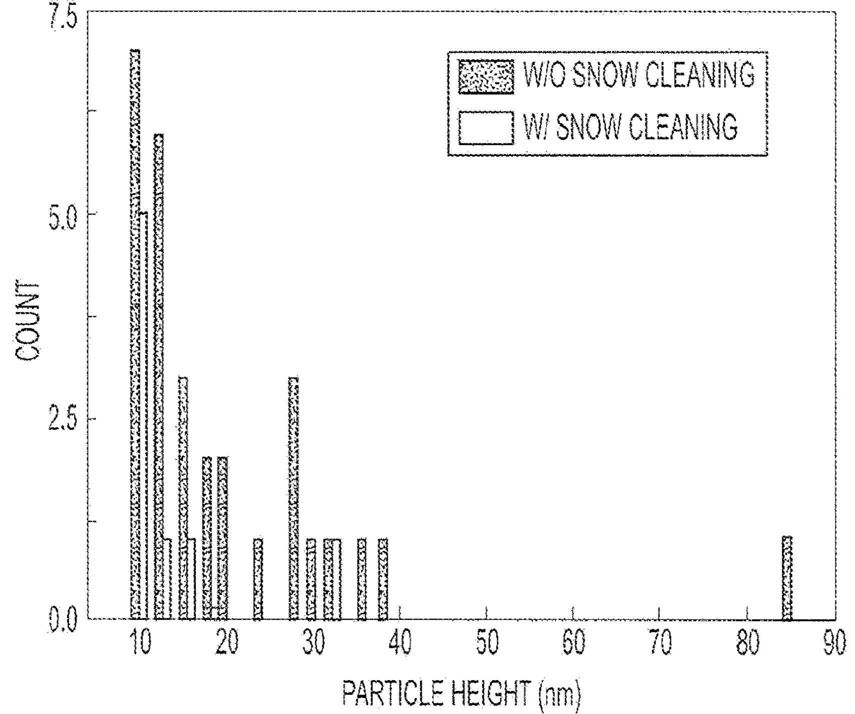
FIG. 1C

LARGE AREA ORGANIC PHOTOVOLTAICS

CROSS-REFERENCE TO RELATED APPLICATIONS

This application claims the benefit of U.S. Provisional Application No. 61/664,058 filed Jun. 25, 2012, which is incorporated herein by reference in its entirety.

STATEMENT REGARDING FEDERALLY SPONSORED RESEARCH

This invention was made with Government support under DE-EE0005310 awarded by the Department of Energy and FA9550-10-1-0339 awarded by the Air Force Office of Scientific Research. The government has certain rights in the invention.

JOINT RESEARCH AGREEMENT

The subject matter of the present disclosure was made by, on behalf of, and/or in connection with one or more of the following parties to a joint university-corporation research agreement: University of Michigan and Global Photonic Energy Corporation. The agreement was in effect on and before the date the subject matter of the present disclosure was prepared, and was made as a result of activities undertaken within the scope of the agreement.

The present disclosure generally relates to methods of making organic photovoltaic (OPV) devices, such as solar cells, through the use of large areas of organic molecular layers.

Photosensitive optoelectronic devices convert electromagnetic radiation into electricity. Solar cells are a type of photosensitive optoelectronic device that are specifically used to generate electrical power.

To produce internally generated electric fields, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n- or p-type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies. The Fermi energy characterizes the statistical occupation of molecular quantum energy states denoted by the value of energy for which the probability of occupation is equal to ½. A Fermi energy near the conduction band minimum energy indicates that electrons are the predominant carrier. A Fermi energy near the valence band maximum energy indicates that holes are the predominant carrier. Accordingly, the Fermi energy is a primary characterizing property of traditional semiconductors and the prototypical PV junction has traditionally been the p-n interface.

OPV devices are a promising renewable and green energy source because of their potential for low cost solar energy conversion.

When an organic material suitable for an optical device is irradiated with appropriate light a photon is absorbed by a molecular component of the material and, as a result, an excited state of the molecular component is produced: an electron is promoted from the HOMO (highest occupied molecular orbital) state to the LUMO (lowest unoccupied molecular orbital) state of the molecule, or a hole is promoted from the LUMO to the HOMO. Thus, an exciton, i.e. an electron-hole pair state is generated. This exciton state has a natural life-time before the electron and the hole will recombine. In order to create a photocurrent the components of the electron-hole pair have to be separated. The separation can be achieved by juxtaposing two layers of materials with different conductive properties. The interface between the layers forms a photovoltaic heterojunction and it should have an asymmetric conduction characteristic, i.e., it should be capable of supporting electronic charge transport preferably in one direction.

New concepts and approaches have been introduced to improve OPV device performance, and state-of-the-art OPV devices achieve power conversion efficiency values that are close to the threshold required for commercial development. Particulates, however, on substrates (for example, ITO-coated glass), can result in electrical shorts between the electrodes that reduce yield, especially in large-area cells. To develop commercially attractive OPV modules, increasing cell area while maintaining high yield and performance is important.

In one embodiment, the present disclosure provides a multi-layer solar device comprising a substrate, and an active area comprising at least one donor material and at least one acceptor material deposited on a surface of the substrate, wherein the donor and acceptor materials are comprised of organic molecules, and wherein particulates are removed from the surface of the substrate before deposition of the donor and acceptor materials.

In another embodiment, the present disclosure provides a multi-layer solar device comprising a pre-cleaned substrate having a surface substantially free of particulates, and an active area comprising at least one donor material and at least one acceptor material disposed on the surface of the substrate, wherein the donor and acceptor materials are comprised of organic molecules.

In another embodiment, the present disclosure provides a multi-layer solar device comprising a pre-cleaned substrate having a surface substantially free of particulates, two electrodes in superposed relation disposed on the surface of the pre-cleaned substrate, and an active area comprising at least one donor material and at least one acceptor material, wherein the donor and acceptor materials are comprised of organic molecules located between the two electrodes.

An additional embodiment of the present disclosure is directed to a process for manufacturing a photovoltaic device comprising, providing a substrate, cleaning a surface of the substrate by exposing the surface to a stream of at least one compound comprising one or more phases chosen from supercritical, gaseous, solid, and liquid phases, and depositing an organic active layer on the surface of the substrate.

In another embodiment of the present disclosure, a process for manufacturing a photovoltaic device comprises, providing a first electrode layer, cleaning the first electrode layer by exposing the first electrode layer to a stream of at least one compound comprising one or more phases chosen from supercritical, gaseous, solid, and liquid phases, providing a second electrode, wherein an organic active layer is deposited between the first electrode layer and the second electrode layer.

In another embodiment, the present disclosure provides a process for manufacturing a photovoltaic device comprising, providing a substrate, cleaning a surface of the substrate by exposing the surface to a stream of at least one compound comprising one or more phases chosen from supercritical, gaseous, solid, and liquid phases, depositing two electrodes in superposed relation on the surface of the substrate, wherein an organic active layer is deposited between the two electrodes.

In yet another embodiment, the present disclosure provides a process for manufacturing a photovoltaic device comprising, providing a first electrode layer, cleaning the first electrode layer by exposing the first electrode layer to a stream of at least one compound comprising one or more phases chosen from supercritical, gaseous, solid, and liquid phases, providing a second electrode layer, depositing an organic active layer between the first electrode layer and the second electrode layer, and wherein the thickness of the organic layer is such that it improves yield over a yield obtained without cleaning the first electrode layer with the stream of the at least one compound.

FIG. 1 depicts representative atomic force micrographs of the surface of indium tin oxide-coated glass substrates (a) before and (b) after $CO_2$ snow cleaning, and (c) the statistics of particle heights on the two differently treated surfaces.

Figure 7:
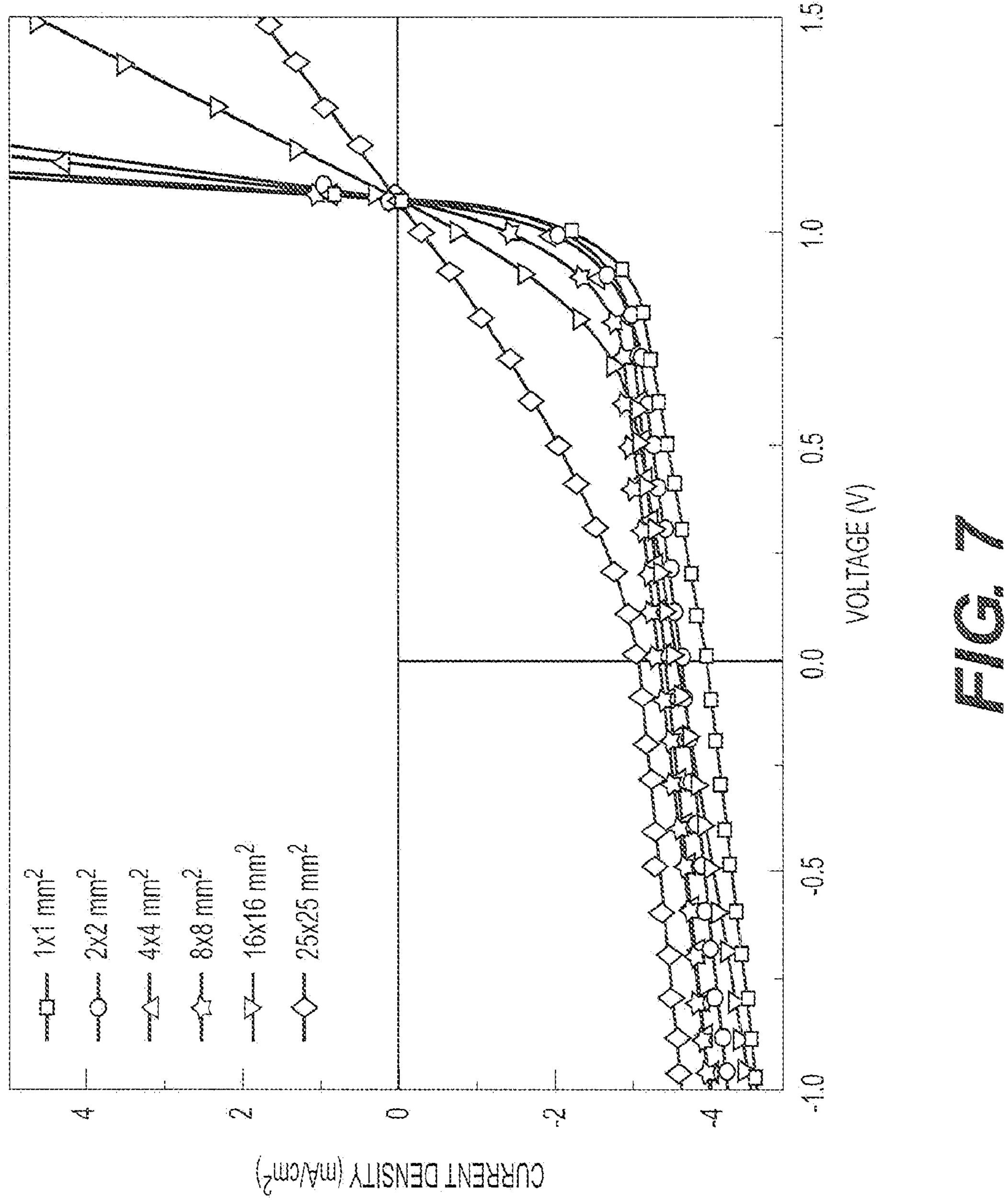

A: (control device): ITO/$MoO_3$ (10 nm)/SubPc (13 nm)/$C_{60}$ (40 nm)/BCP (8 nm)/Al B: ITO/PEDOT:PSS (50 nm)/$MoO_3$ (5 nm)/SubPc (13 nm)/$C_{60}$ (40 nm)/BCP (8 nm)/Al C: ITO/$MoO_3$ (30 nm)/SubPc (13 nm)/$C_{60}$ (40 nm)/BCP (8 nm)/Al FIG. 7 depicts current density vs voltage curves under 1 sun, AM 1.5 G illumination for devices having a structure of ITO/$MoO_3$ (10 nm)/SubPc (13 nm)/$C_{60}$ (40 nm)/BCP (8 nm)/Al with various active areas and with snow-plus-solvent cleaned substrates.

Figure 8:
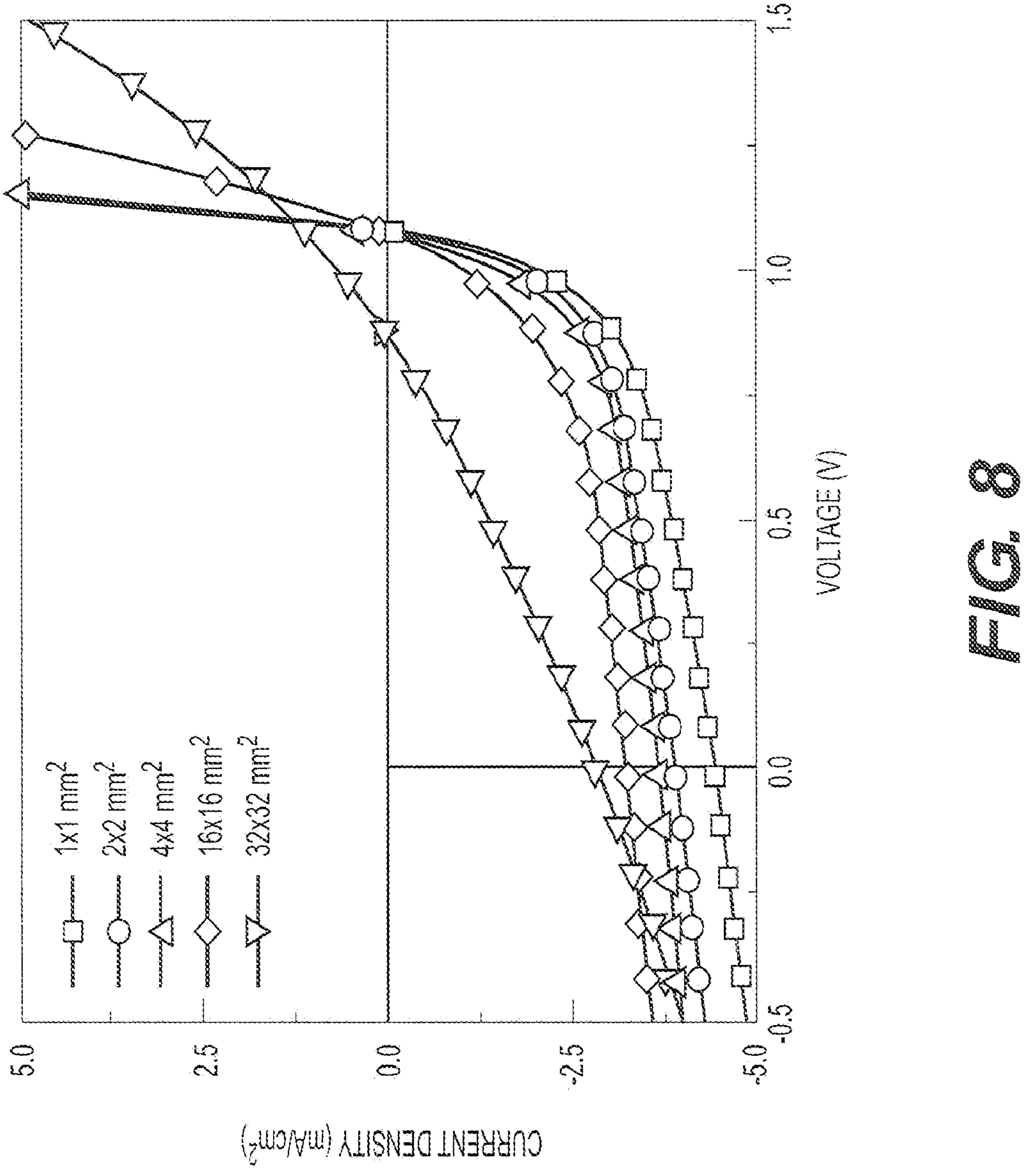

FIG. 8 depicts current density vs voltage curves under 1 sun, AM 1.5 G illumination for devices having a structure of ITO/$MoO_3$ (10 nm)/SubPc (13 nm)/$C_{60}$ (40 nm)/BCP (8 nm)/Al with various active areas and with only snow-cleaned substrates.

Figure 9:
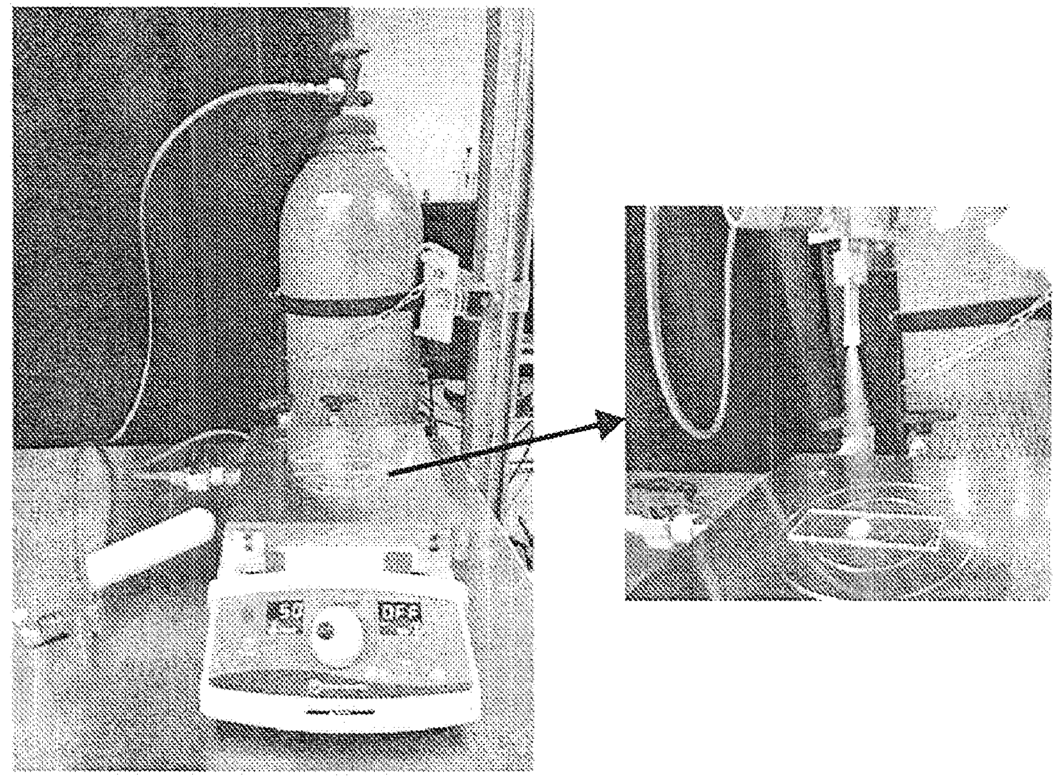

FIG. 9 is an illustration of a snow cleaning apparatus, including a $CO_2$ source, a nozzle and a sample holder.

As used herein, the term "layer" refers to a member or component of a photosensitive device whose primary dimension is X-Y, i.e., along its length and width, and is typically perpendicular to the plane of incidence of the illumination. It should be understood that the term "layer" is not necessarily limited to single layers or sheets of materials. A layer can comprise laminates or combinations of several sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, the expression "disposed on" permits other materials or layers to exist between a disposed material and the material on which it is disposed. Likewise, the expression "deposited on" permits other materials or layers to exist between a deposited material and the material on which it is deposited. Thus, other materials or layers may exist between a surface of a substrate and a material "disposed on" or "deposited on" the surface of the substrate.

As used herein, the term "yield" refers to the proportion of devices, made or manufactured by a process, that performs within a given range of specifications.

As described herein, exposing the surface of a substrate to a stream of at least one compound comprising one or more phases chosen from supercritical, gaseous, solid, and liquid phases permits the manufacture of large area solar devices having thin organic layers, e.g., a total deposited thickness of ~70 nm, without compromising, and even increasing, yield. In some embodiments, the substrate is an ITO-coated substrate.

In one embodiment, the present disclosure provides a multi-layer solar device comprising a substrate, and an active area comprising at least one donor material and at least one acceptor material deposited on a surface of the substrate, wherein the donor and acceptor materials are comprised of organic molecules, and wherein particulates are removed from the surface of the substrate before deposition of the donor and acceptor materials. In another embodiment, the present disclosure provides a multi-layer solar device comprising a pre-cleaned substrate having a surface substantially free of particulates, and an active layer comprising at least one donor material and at least one acceptor material disposed on the surface of the substrate, wherein the donor and acceptor materials are comprised of organic molecules.

In some embodiments, the surface of the substrate comprises an electrode, such as an anode or cathode. In other embodiments, the multi-layer solar device further comprises an electrode deposited on the substrate, wherein particulates are removed from the surface of the substrate before deposition of the electrode.

In another embodiment, a multi-layer solar device comprises a pre-cleaned substrate having a surface substantially free of particulates, two electrodes in superposed relation disposed on the surface of the pre-cleaned substrate, and an active area comprising at least one donor material and at least one acceptor material, wherein the donor and acceptor materials are comprised of organic molecules located between the two electrodes.

In some embodiments, the particulates are removed by exposing the surface of the substrate to a stream of at least one compound comprising one or more phases chosen from supercritical, gaseous, solid, and liquid phases. This process is referred to herein as "snow cleaning." In some embodiments, a substrate is pre-cleaned by snow cleaning.

In some embodiments, the stream of the at least one compound contains at least gaseous and solid phases. In certain embodiments, the stream of the at least one compound contains gaseous, solid, and liquid phases. In certain embodiments, the stream of the at least one compound comprises a supercritical fluid.

In some embodiments, the at least one compound is chosen to be gaseous at room temperature and atmospheric pressure. In further embodiments, the at least one compound forms a liquid or solid upon cooling below room temperature.

In some embodiments, the exposure to the stream of the at least one compound is via directed flow. In certain embodiments, the at least one compound used to remove particulates is $CO_2$. This process of $CO_2$ based cleaning is referred to as $CO_2$ snow cleaning, or $CO_2$ cleaning. $CO_2$ snow cleaning is nondestructive, nonabrasive, residue-free, and environmentally friendly.

In some embodiments, a compound other than, or in addition to, $CO_2$ is selected and used in a manner as described herein. The molecule chosen could be selected based on solvation properties for a particular contaminate, or chosen to create a stream containing one or more phases chosen from gas, liquid, solid and supercritical phases. Examples of compounds may include ammonia, nitrous oxide, various hydrocarbons such as acetylene, propane, butane or other hydrocarbons, various chlorinated hydrocarbons such as chloroethanes, various fluorinated hydrocarbons such as fluoroethanes, or mixtures thereof. Exemplary compounds include those that form a liquid or solid upon cooling below room temperature.

In some embodiments, snow-cleaned substrates are prepared by exposing a surface of the substrate to at least one compound, such as $CO_2$, around its triple point, i.e., in various parts of the stream, gas, liquid, and solid phases are present.

In general, snow cleaning relies on the expansion of a liquid or gaseous compound, e.g., $CO_2$, as it emerges from an orifice. The resulting stream of material, e.g, a combination of at least solid and gaseous phases, physically remove particulates by the momentum of the impacting solid particles and/or by the momentum of the gas, thereby overcoming the adhesional force binding particulates to the surface. Other residues on the substrate can be removed by dissolution of contaminates into a liquid or supercritical fluid.

In some embodiments of the present disclosure, the active area of the solar device ranges from about 0.01 $cm^2$ to about 1000 $cm^2$, from about 0.1 $cm^2$ to about 100 $cm^2$, from about 0.5 $cm^2$ to about 50 $cm^2$, from about 1 $cm^2$ to about 10 $cm^2$, and from about 2.56 $cm^2$ to about 6.25 $cm^2$. In yet another embodiment, the active area ranges from about 0.1 $cm^2$ to about 6.25 $cm^2$.

In some embodiments, the active area of the solar device is a large area of at least about 0.25 $cm^2$, about 0.5 $cm^2$, about 1 $cm^2$, about 5 $cm^2$, about 6.25 $cm^2$, about 10 $cm^2$, about 50 $cm^2$, about 100 $cm^2$, or about 1000 $cm^2$.

Removed particulates may vary in size. In some embodiments, particulates that are removed range in diameter from about 5 nm to about 1000 nm, from about 15 nm to about 200 nm, from about 20 nm to about 100 nm, and from about 30 nm to about 60 nm.

In some embodiments, the organic active layer has a thickness ranging from about 10 nm to about 400 nm, from about 15 nm to about 120 nm, from about 20 nm to about 100 nm, and from about 50 to about 80 nm.

In some embodiments, devices are prepared using snow-cleaned substrates without any additional cleaning techniques. In another embodiment, the surface of the substrate is cleaned using a technique in addition to snow cleaning. Non-limiting examples of such additional techniques include wiping with a dry or wetted clean wipe, sonicating in detergent-water mixtures, and soaking in solvents such as, for example, trichloroethylene, acetone, and isopropanol.

In yet another embodiment, snow cleaning increases yield without compromising efficiency. In some embodiments, snow cleaning reduces or eliminates short circuits in the solar device.

An additional embodiment of the present disclosure is directed to a process for manufacturing a photovoltaic device comprising, providing a substrate, cleaning a surface of the substrate by exposing the surface to a stream of at least one compound comprising one or more phases chosen from supercritical, gaseous, solid, and liquid phases, and depositing an organic active layer on the surface of the substrate.

In some embodiments, the surface of the substrate exposed to the stream of the at least one compound comprises an electrode, such as an anode or cathode. In some embodiments, the process for manufacturing a photovoltaic device further comprises depositing two electrodes in superposed relation on the cleaned surface of the substrate, wherein the organic active layer is deposited between the two electrodes.

In another embodiment of the present disclosure, a process for manufacturing a photovoltaic device comprises, providing a first electrode layer, cleaning the first electrode layer by exposing the first electrode layer to a stream of at least one compound comprising one or more phases chosen from supercritical, gaseous, solid, and liquid phases, providing a second electrode, wherein an organic active layer is deposited between the first electrode layer and the second electrode layer.

In yet another embodiment, the present disclosure provides a process for manufacturing a photovoltaic device comprising, providing a first electrode layer, cleaning the first electrode layer by exposing the first electrode layer to a stream of at least one compound comprising one or more phases chosen from supercritical, gaseous, solid, and liquid and combinations thereof, providing a second electrode layer, depositing an organic active layer between the first electrode layer and the second electrode layer, wherein the thickness of the organic active layer is such that it improves yield over a yield obtained without cleaning the first electrode layer with the stream of the at least one compound.

The organic active layer as used herein may comprise at least one donor material and at least one acceptor material.

In some embodiments, the stream of the at least one compound contains at least gaseous and solid phases. In certain embodiments, the stream of the at least one compound contains gaseous, solid, and liquid phases. In certain embodiments, the stream of the at least one compound comprises a supercritical fluid.

In some embodiments, the at least one compound is chosen to be gaseous at room temperature and atmospheric pressure. In further embodiments, the at least one compound forms a liquid or solid upon cooling below room temperature.

In some embodiments, the exposure to the at least one compound is via directed flow. In certain embodiments, the at least one compound is $CO_2$.

In some embodiments, a compound other than, or in addition to, $CO_2$ is selected and used in a manner as described herein. The molecule chosen could be selected based on solvation properties for a particular contaminate, or chosen to create a stream containing one or more phases chosen from gas, liquid, solid and supercritical phases. Examples of compounds may include ammonia, nitrous oxide, various hydrocarbons such as acetylene, propane, butane or other hydrocarbons, various chlorinated hydrocarbons such as chloroethanes, various fluorinated hydrocarbons such as fluoroethanes, or mixtures thereof. Exemplary compounds include those that form a liquid or solid upon cooling below room temperature.

In certain embodiments, the organic active layer has an area ranging from about 0.01 $cm^2$ to about 1000 $cm^2$, from about 0.1 $cm^2$ to about 100 $cm^2$, from about 0.5 $cm^2$ to about 50 $cm^2$, from about 1 $cm^2$ to about 10 $cm^2$, and from about 2.56 $cm^2$ to about 6.25 $cm^2$. In certain embodiments, the active area ranges from about 0.1 $cm^2$ to about 6.25 $cm^2$.

In some embodiments, the organic active layer has a large area of at least about 0.25 $cm^2$, about 0.5 $cm^2$, about 1 $cm^2$, about 5 $cm^2$, about 6.25 $cm^2$, about 10 $cm^2$, about 50 $cm^2$, about 100 $cm^2$, or about 1000 $cm^2$.

In some embodiments, the organic active layer has a thickness ranging from about 10 nm to about 400 nm, from about 15 nm to about 120 nm, from about 20 nm to about 100 nm, and from about 50 to about 80 nm.

Additional layers, e.g., buffer layers and smoothing layers, may be deposited between the two electrodes. In some embodiments, the thickness of the deposited layers (e.g., buffer layers, smoothing layers, and/or active layers) are chosen to improve yield. In some embodiments, increasing the thickness of the deposited layers (e.g. buffer layers, smoothing layers, and/or active layers) improves yield.

In one embodiment, snow cleaning is performed before loading into a chamber, such as in the room ambient. In another embodiment, snow cleaning is performed in a load lock of a deposition tool, wherein the load lock is a chamber that holds a substrate. In some embodiments, the chamber is pumped down, a valve is opened to the chamber, and a substrate is transferred into the chamber. This allows samples to be loaded into the deposition chamber without exposing the chamber to ambient or atmospheric pressure gases.

In yet another embodiment, snow cleaning is performed in a deposition chamber.

In one embodiment, the present disclosure relates to an active area within a solar device comprising one or more materials that include a variety of conjugated organic molecules, such as, but not limited to phthalocyanines, functionalized squaraines, functionalized polyacenes, oligothiophenes, merocyanine dyes, modified perylenes (e.g. DIP or DBP), conducting polymers, low-bandgap polymers, etc. as donor materials, and acceptor materials such as, but not limited to, the fullerenes, $C_{60}$ or $C_{70}$, or modified polyacenes such as NTCDA, PTCDA, PTCBI, PTCDI, etc.

In some embodiments, the organic active layers are deposited on a substrate, for example, a piece of glass, metal or polymer. For solar cells, for example, the substrate may be transparent, such as glass. In some embodiments, the substrate comprises an electrode. In particular, the surface of the substrate exposed to the stream of the at least one compound may comprise the electrode. The electrode may be applied to serve as a conducting contact to the organic active layers. In some embodiments, the conducting electrode layer comprises an oxide, such as, indium/tin oxide (ITO).

In another embodiment, OPV devices are made by sandwiching organic layers between two metallic conductors, typically a layer of ITO with high work function and a layer of low work function metal such as Al, Mg or Ag.

In some embodiments, the substrate surface is cleaned and particulates are removed before depositing layers on the substrate.

In another embodiment, increasing the thickness of deposited layers can at least partially mitigate yield loss. Thickness can be increased by using a buffer layer, e.g., poly (3,4-ethylenedioxythiophene):poly (styrenesulfonate) (PEDOT:PSS) or a thick, e.g., 250 nm, polymer bulk heterojunction active layer or a thicker than normal (t=103 nm) organic layer, e.g., pentacene/$C_{60}$/BCP. In yet another embodiment, a thick, $MoO_3$ layer can be deposited on a substrate surface, such as an ITO surface.

In some embodiments, solar cells fabricated and cleaned according to the methods of the present disclosure have a reduced occurrence of electrical shorts. Additionally, in some embodiments, a subelectrode structure may be used to reduce device resistance.

In some embodiments, OPV devices may be fabricated using one or more substrate cleaning procedures, e.g., solvent cleaning, in addition to snow cleaning. Snow cleaning, in particular $CO_2$ snow cleaning, was found to be more effective than conventional solvent cleaning in reducing the density of defects that lead to shorts and variations in device performance, especially large-area devices.

EXAMPLES

The present disclosure will now be described in greater detail by the following non-limiting examples. It is understood that the skilled artisan will envision additional embodiments consistent with the disclosure provided herein.

Example 1

Preparing substrates without snow cleaning: SubPc/$C_{60}$ devices with areas A>0.64 $cm^2$ have low yield due to shorts caused by particulates. To improve yield, a thick buffer layer (PEDOT:PSS or $MoO_3$) prior to active layer deposition was employed. The device structures were ITO/Buffer layer(s)/SubPc (13 nm)/$C_{60}$ (40 nm)/BCP (8 nm)/Al. Materials were deposited on ITO-coated glass substrates, with an ITO thickness of ~100 nm and a sheet resistance of 20±5 Ω/sq. $MoO_3$, boron subphthalocyanine chloride (SubPc), $C_{60}$, and bathocuproine (BCP) were sequentially thermally evaporated at rates of 0.05, 0.1, 0.1, and 0.05 nm/s, respectively, followed by a 100 nm thick Al cathode deposited at 0.1 nm/s through a shadow mask. All deposition rates and thicknesses were measured using a quartz crystal monitor and calibrated by variable angle spectroscopic ellipsometry. $MoO_3$ (Acros, 99.999%) and BCP (Lumtec, 99.5%) were used as received, and SubPc (Lumtec, 99%) and $C_{60}$ (MER, 99.9%) were further purified in a single cycle by thermal gradient sublimation. In one example, PEDOT:PSS (H.G. Stark, Clevios PH 500) was spun-coated, while $MoO_3$ was thermally evaporated in vacuum.

The fabricated device structures were as follows:

Device A (control): ITO/$MoO_3$ (10 nm)/SubPc (13 nm)/$C_{60}$ (40 nm)/BCP (8 nm)/Al);

Device B: ITO/PEDOT:PSS (50 nm)/$MoO_3$ (5 nm)/SubPc (13 nm)/$C_{60}$ (40 nm)/BCP (8 nm)/Al, Device C: ITO/$MoO_3$ (30 nm)/SubPc (13 nm)/$C_{60}$ (40 nm)/BCP (8 nm)/Al.

Figure 6:
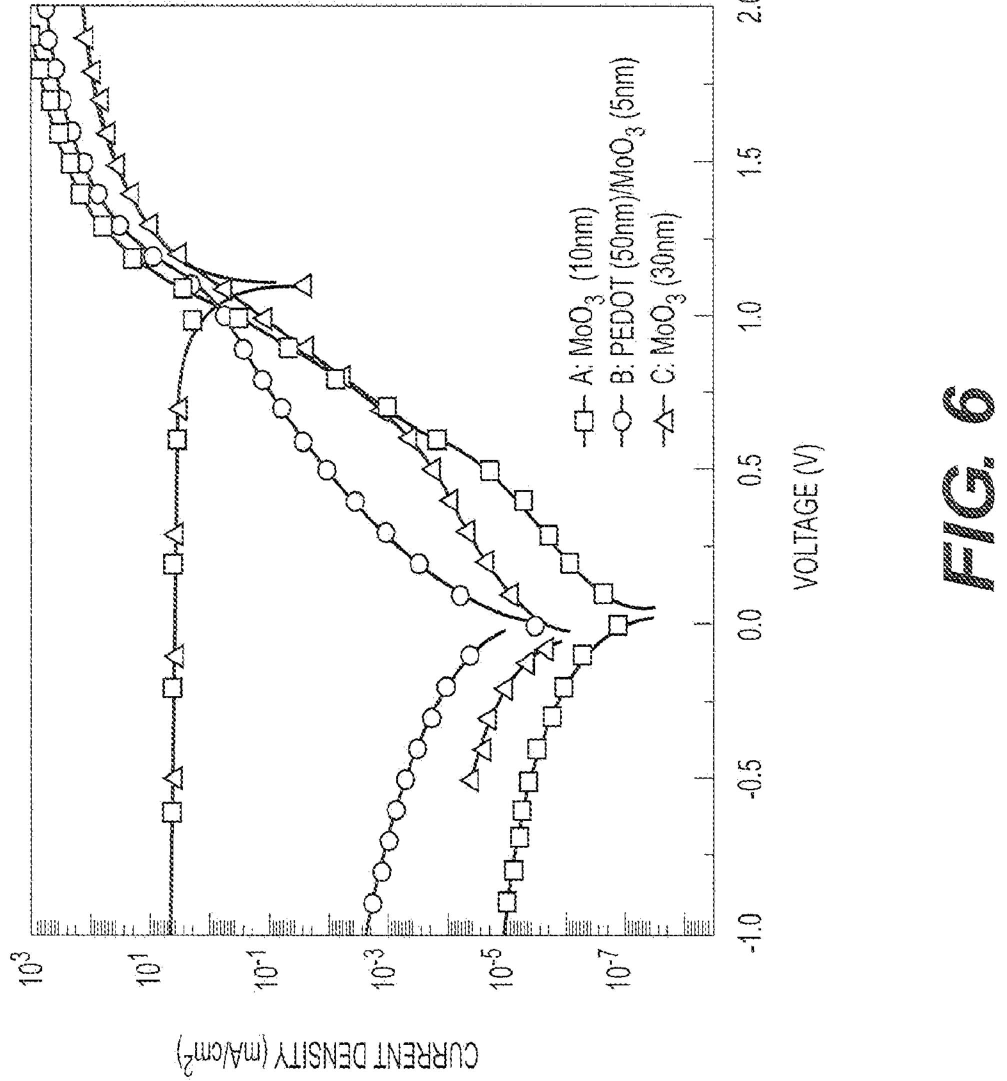
FIG. 6 depicts current density vs voltage curves under 1 sun, AM 1.5 G illumination for three devices: A, B and C represented by a square, circle and triangle in the legend, respectively.

As shown in Table 1 and FIG. 6, the increase of deposited layer thickness can degrade device performance. For the small area device (0.00785 $cm^2$), the power conversion efficiency of the control structure (Device A: $MoO_3$ (10 nm)) was $\eta_p$=2.69±0.03%, decreasing to 2.47±0.08% for devices with a PEDOT:PSS smoothing layer (Device B: PEDOT: PSS (50 nm)/$MoO_3$ (5 nm)), and 2.32±0.02% for devices with a relatively thick $MoO_3$ layer (Device C: $MoO_3$ (30 nm)). The decrease in efficiency for Devices B and C as compared to A arises primarily from a reduced fill factor. It is foreseeable that one would want to both snow clean and use a thicker buffer layer to minimize shorting as much as possible.

Fitting the dark J-V characteristics following the theory of Giebink, as described in C. Giebink, G. P. Wiederrecht, M. R. Wasielewski, and S. R. Forrest, Phys. Rev. B 82, 155305 (2010), we found that the series resistance of Device C was $R_SA$=5.4±0.1 Ω·$cm^2$ whereas $R_SA$=0.77±0.02 Ω·$cm^2$ for Device A. The increase in $R_SA$ was due to the increased $MoO_3$ layer thickness, which in turn led to a reduced FF and thus $\eta_p$. Moreover, Device B had a larger dark saturation current density and smaller ideality factor that also led to a reduction in FF.

from a filtered Xe lamp were measured in a high-purity N2 filled glovebox. Optical intensities were referenced using an NREL-calibrated Si detector, and photocurrent measurements were corrected for spectral mismatch. Errors quoted correspond to the standard deviation for a device population of three or more.

Atomic force microscope (AFM) images in FIG. 1(*a*) show large particles distributed on the surface prior to snow cleaning, while FIG. 1(*b*) shows that the largest particulates in the population had been completely removed by the cleaning process. The root-mean-square roughness for the ITO substrates decreased from 1.76 nm to 1.21 nm, but more importantly, the peak-to-valley roughness decreased from 84.2 nm to 32.4 nm. The largest of the particulates is most likely to short the devices as they were larger than the total organic layer thickness, and often were thicker than the entire active organic layer region. The particle size count statistics in FIG. 1(*c*) show that snow cleaning had removed most median-sized, and all large particles.

Large-area, snow-cleaned devices with thin organic layers (i.e. $t_{org}$≈75 nm) were also fabricated. Thermally evaporated and solution-processed devices with structures of ITO/$MoO_3$ (10 nm)/SubPc (13 nm)/$C_{60}$ (40 nm)/BCP (8 nm)/Al

TABLE 1

The performance of representative SubPc/$C_{60}$ devices.

| Device | FF | $\eta_P$ (%) | $R_SA$ (Ω · $cm^2$) | $\eta_D$ | $J_{sC}$ (mA/$cm^2$) |
|---|---|---|---|---|---|
| A | 0.62 ± 0.01 | 2.69 ± 0.03 | 0.77 ± 0.02 | 6.7 ± 0.6 | (2.8 ± 0.1) × $10^{-3}$ |
| B | 0.56 ± 0.01 | 2.47 ± 0.08 | 1.2 ± 0.1 | 4.5 ± 0.1 | (1.3 ± 0.1) × $10^{-4}$ |
| C | 0.53 ± 0.01 | 2.32 ± 0.02 | 5.4 ± 0.1 | 8.4 ± 0.3 | (1.5 ± 0.1) × $10^{-5}$ |

Example 2

An alternative to thicker buffer or active layers is to remove particulates and other asperities from the ITO surface using $CO_2$ snow cleaning. Materials were deposited on ITO-coated glass substrates, with an ITO thickness of ~100 nm and a sheet resistance of 20±5 Ω/sq. Prior to film deposition, the ITO was cleaned as follows: first the substrate was gently wiped with a dry particle free wipe followed by 5 minute sonication in a tergitol-deionized water solution, 5 minute sonication in acetone, 10 minute soak in boiling trichloroethylene, 10 minute sonication in acetone, and 10 minute immersion in boiling isopropanol. Snow cleaning was then performed for 90 seconds using an Applied Surface Technologies (New Providence, NJ, 07974) high-purity Model K4 snow cleaner. The substrates were held at 50° C., with a nozzle angle of 45° with respect to the substrate, and a nozzle-to-substrate distance of ~5 cm. The ITO was then exposed to ultraviolet-ozone for 10 minutes before loading into a high vacuum chamber (base pressure <2×10-7 Torr). Next, $MoO_3$, boron subphthalocyanine chloride (SubPc), $C_{60}$, and bathocuproine (BCP) were sequentially thermally sublimed at rates of 0.05, 0.1, 0.1, and 0.05 nm/s, respectively, followed by a 100 nm thick Al cathode deposited at 0.1 nm/s through a shadow mask. All deposition rates and thicknesses were measured using a quartz crystal monitor and calibrated by variable angle spectroscopic ellipsometry. $MoO_3$ (Acros, 99.999%) and BCP (Lumtec, 99.5%) were used as received, and SubPc (Lumtec, 99%) and $C_{60}$ (MER, 99.9%) were further purified in a single cycle by thermal gradient sublimation.

Current density-vs.-voltage (J-V) characteristics in the dark and under simulated, 1 sun AM 1.5 G solar illumination (Device D) and ITO/$MoO_3$ (15 nm)/DPSQ (13 nm)/$C_{60}$ (40 nm)/BCP (8 nm)/Al (Device E), respectively, were prepared with active areas from 0.01 to 6.25 $cm^2$. The partially solution-processed DPSQ/$C_{60}$ devices were fabricated where the DPSQ was spin coated on the $MoO_3$ surface from 1.6 mg/ml chloroform solution at a rate of 3000 rpm for 30 seconds.

Figures 2A, 2B:
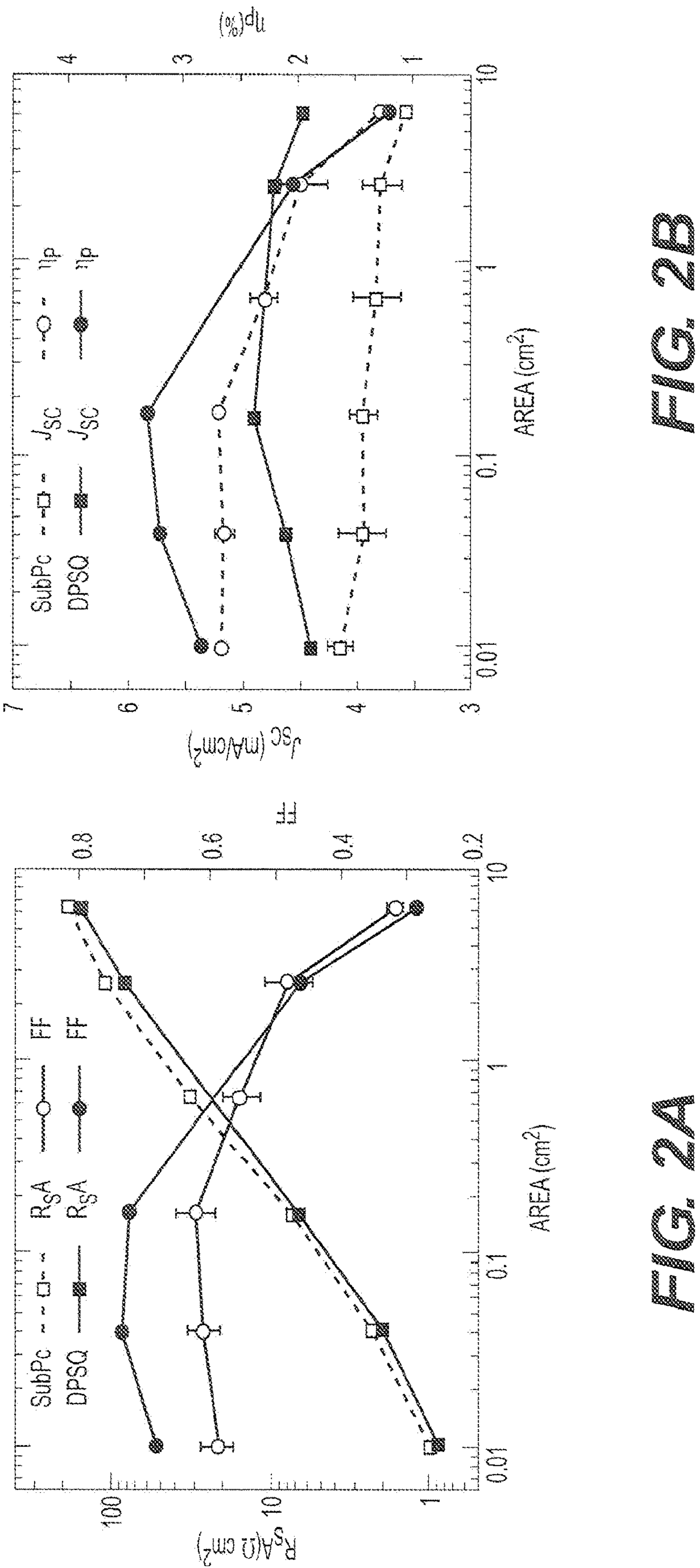
FIG. 2 depicts (a) series resistance ($R_sA$) and fill factor (FF) for SubPc (open squares and dashed line), and DPSQ (solid squares and solid line) based OPV cells employing a $C_{60}$ acceptor, (b) Short-circuit current ($J_{SC}$) and power conversion efficiency ($\eta_p$) for SubPc and DPSQ OPV devices with different areas. The same line symbols are used as in (a).

As the area increases, no significant changes were observed in the open-circuit voltage ($V_{OC}$), although the FF decreased for both Devices D and E as shown in FIG. 2. The decrease in FF was due to the increase in series resistance from $R_SA$≈1 Ω·$cm^2$ for device with A=0.01 $cm^2$, to $R_SA$≈180 Ω·$cm^2$ for the device with A=6.25 $cm^2$, resulting in a concomitant decrease in short-circuit current ($J_{SC}$). From FIG. 2, it is apparent that the series resistance needed to be $R_SA$<10 Ω·$cm^2$ to maintain the small-area device performance with increasing device size.

Figure 3:
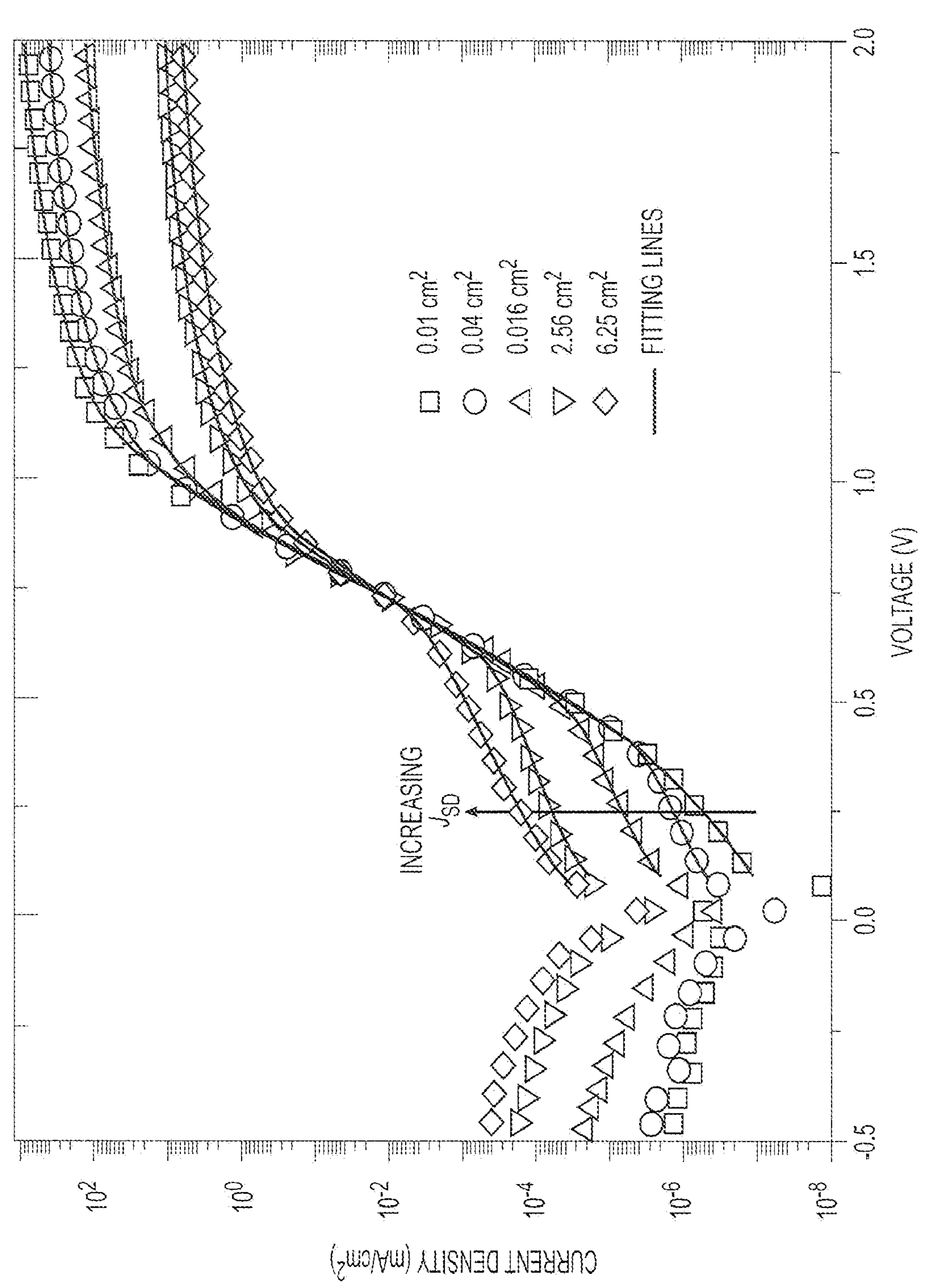
FIG. 3 depicts dark current density-vs-voltage (J-V) curves for ITO/$MoO_3$ (15 nm)/DPSQ (13 nm)/$C_{60}$ (40 nm)/BCP (8 nm)/Al devices with various active areas.

In addition to the increase in $R_SA$, larger area devices can also exhibit high dark current. In FIG. 3, the dark J-V characteristics for DPSQ/$C_{60}$ cells with different areas were fitted using the analysis of Giebink described in C. Giebink, G. P. Wiederrecht, M. R. Wasielewski, and S. R. Forrest, Phys. Rev. B 82, 155305 (2010). The results showed that the dark current due to leakage originating from the $C_{60}$ acceptor layer had an area-independent saturation current density of $J_{sA}$=(5.7±1.7)×$10^{-11}$ mA/$cm^2$ and a corresponding ideality factor of $n_A$=1.50±0.01. However, the leakage dark current at low bias (e.g. less than 0.4 V) and often associated with the donor, $J_{sD}$, increased by approximately 3 decades, from (1.0±0.3)×$10^{-7}$ mA/$cm^2$ to (0.9±0.1)×$10^{-4}$ mA/$cm^2$ as area increased from 0.01 $cm^2$ to 6.25 $cm^2$, an approximately linear correspondence. The increased dark current indicated an increased leakage across the donor due to shunt paths induced by particulates not removed by snow cleaning. Hence, it was the donor, deposited directly on the ITO surface, whose leakage was most directly affected by particles on the surface, leading to the observed area dependence of $J_{sD}$.

In addition to an increase in dark current and series resistance, we also found that FF is reduced by shunt paths. This can be understood by including $R_pA$ in the excitonic semiconductor ideal diode equation of Giebink, viz:

$$J = J_s\left[\exp\left(\frac{V - J \cdot R_S A}{nk_B T/q}\right) - \xi\right] + \frac{V - J \cdot R_S A}{R_p A} - J_{ph}(V). \quad (1)$$

For simplicity, we can consider the case of a symmetric diode, with identical transport properties and injection barriers for both electrons and holes. Here, $J_s$ and n are the symmetric device saturation current and ideality factor, respectively, $J_{ph}$ is the photocurrent density, $k_B$ is the Boltzmann constant, T is the temperature, and q is electronic charge. Finally, $\xi$ is the polaron-pair dissociation rate relative to its equilibrium value.

Figure 4:
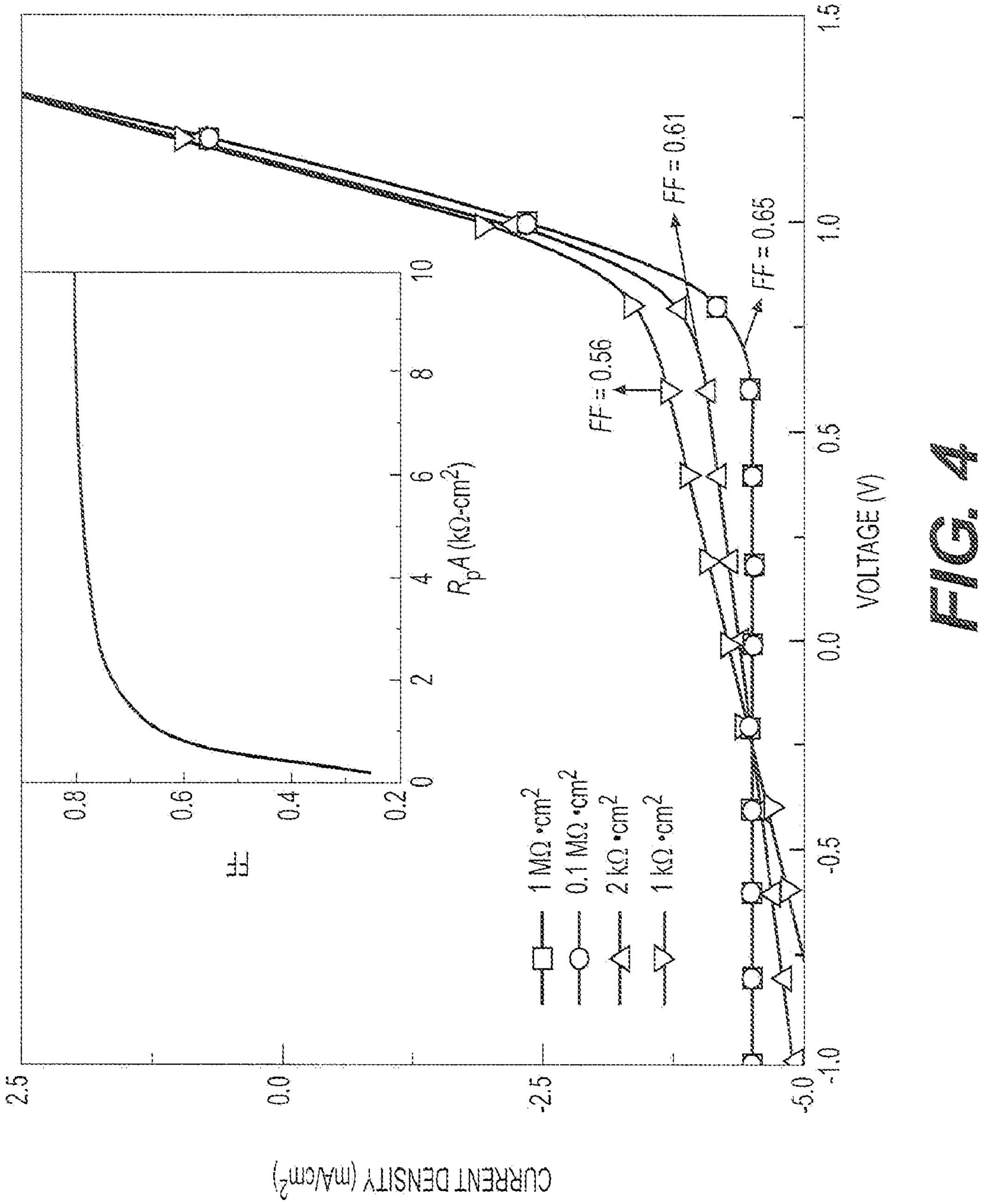
FIG. 4 depicts calculated dark J-V curves assuming $R_SA=50\ \Omega\cdot cm^2$ and variable $R_P$. Inset: calculated relationship between FF and shunt resistance.

FIG. 4 (inset) shows the dependence of FF on $R_pA$, where $J_{SC}=J_{ph}=4.5$ mA/cm$^2$, $J_s=1\times10^{-9}$ mA/cm$^2$, n=2, $\xi=1$ and $R_S=0$. The simulation showed that FF decreased with $R_p$, and was significantly reduced for $R_pA\leq2$ k$\Omega\cdot$cm$^2$. We also plotted the J-V characteristics predicted by Eq. (1) for several values of $R_pA$ in FIG. 4, where we assumed $R_SA=50$ $\Omega\cdot$cm$^2$. There was a pronounced dependence of FF on $R_pA$ which is reflected in the data in FIG. 4. For example, when the shunt resistance was $10^3$ $\Omega\cdot$cm$^2$, FF was reduced by 25% from its value when $R_PA\rightarrow\infty$.

Figure 5:
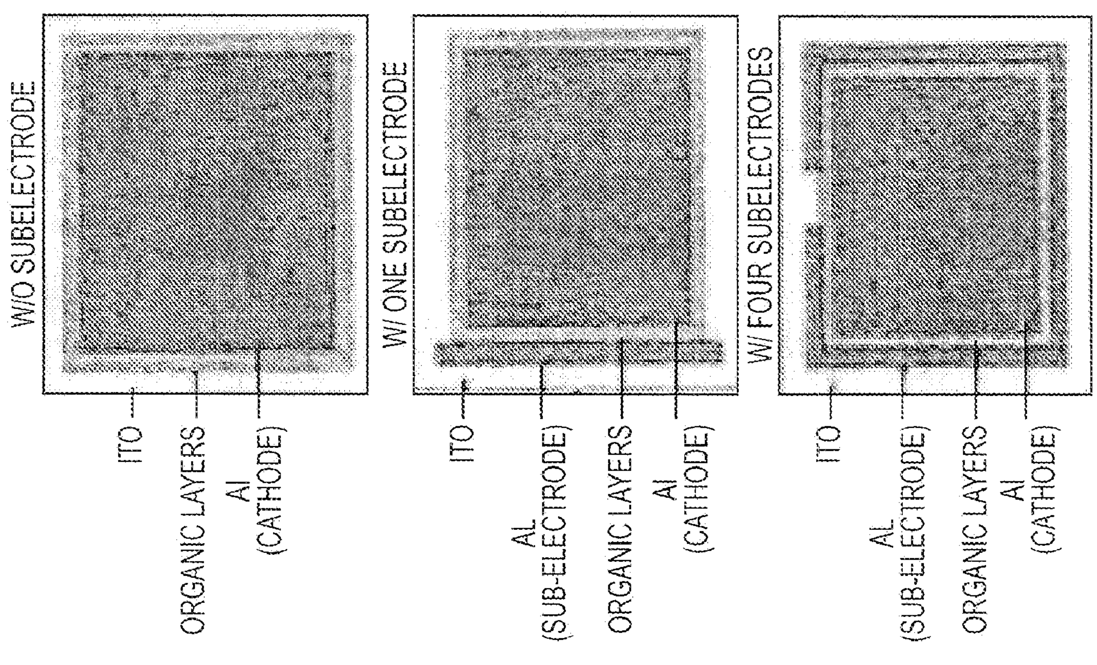
FIG. 5 depicts J-V curves in dark and under 1 sun, AM 1.5 G illumination for 6.25 $cm^2$ devices showing the effects of the subelectrode.
Figure 5:
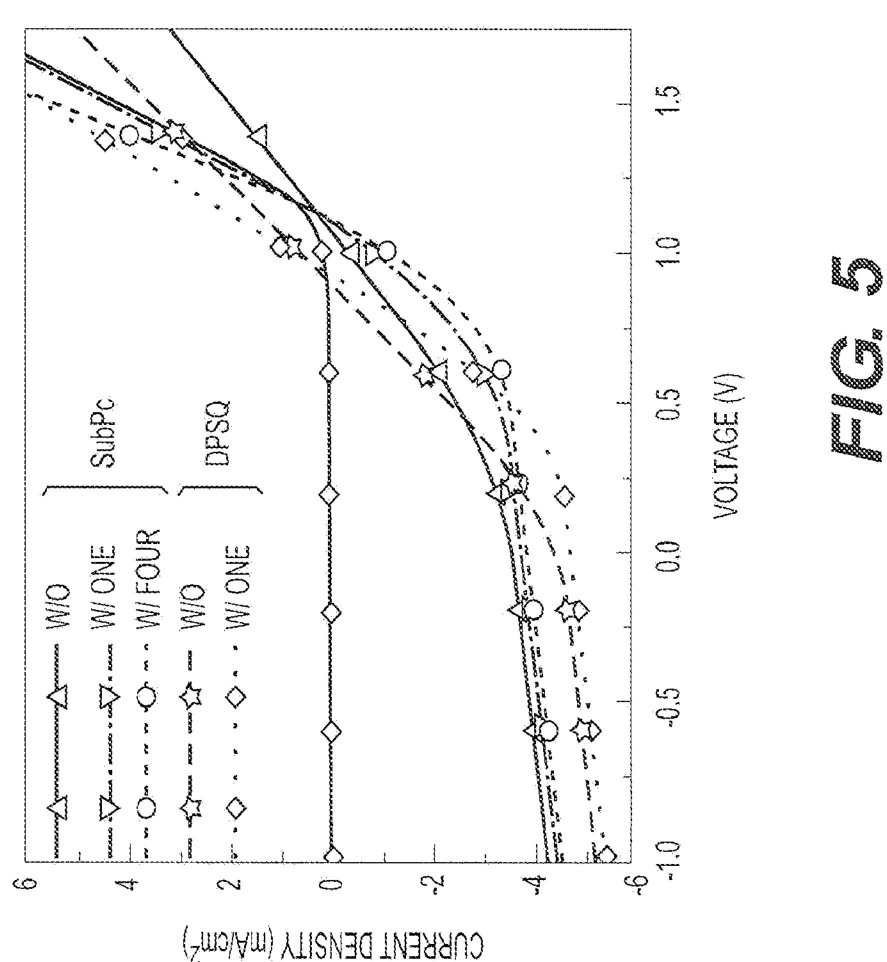

Another factor that led to deterioration in large-area OPV performance was the increase of series resistance dominated by the lateral resistance in the ITO layer. To reduce the effect of $R_S$ on large-area OPV cells, we used a subelectrode structure for devices D and E (FIG. 5 inset). The subelectrode allowed the carriers to travel a shorter distance from their point of generation before being collected at the metal contact. As shown in FIG. 5, under 1 sun, AM 1.5 G illumination, the A=6.25 cm$^2$ SubPc/$C_{60}$ device with no subelectrode showed $\eta_p=1.26\pm0.05\%$ with $J_{SC}=3.55\pm0.04$ mA/cm$^2$, FF=0.32±0.01, and $R_SA=179\pm4$ $\Omega\cdot$cm$^2$. Cells with a single subelectrode had a decreased series resistance of $R_SA=78\pm2$ $\Omega\cdot$cm$^2$, resulting in $J_{SC}=3.91\pm0.09$ mA/cm$^2$, FF=0.46±0.01, and $\eta_p=2.02\pm0.08\%$, while four subelectrodes further decreased the resistance to $R_SA=56\pm3$ $\Omega\cdot$cm$^2$, resulting in $J_{SC}=3.95\pm0.05$ mA/cm$^2$, FF=0.50±0.01, and $\eta_p=2.21\pm0.05\%$. This represented nearly a doubling of $\eta_p$ compared to the device lacking a subelectrode. Similarly, for the DPSQ/$C_{60}$ device, the structure with a single subelectrode reduced $R_SA$ from 152±4 $\Omega\cdot$cm$^2$ to 96±1 $\Omega\cdot$cm$^2$, leading to a corresponding increase of $J_{SC}$ from 4.47 mA/cm$^2$ to 4.76 mA/cm$^2$, FF from 0.29 to 0.40, and $\eta_p$ from 1.21% to 1.78%.

Example 3

Yields were investigated by fabricating a population of 1.44 cm$^2$ devices. The statistics of nineteen 1.44 cm$^2$ out of twenty-seven total devices with snow-plus-solvent cleaned substrates, and sixteen 1.44 cm$^2$ out of twenty-six devices with snow-cleaned-only substrates (without conventional solvent cleaning) were compared in Table 2.

TABLE 2

Parameters of OPVs with area of 1.44 cm$^2$ with and without solvent cleaning. The standard deviation from the mean is SD.

| Cleaning Process | | $V_{OC}$(V) | Jsc (mA/cm$^2$) | FF | $\eta_P$ (%) |
|---|---|---|---|---|---|
| Snow-plus-solvent | Mean | 1.09 | 4.13 | 0.56 | 2.52 |
| | SD/Mean | 0.4% | 1.1% | 3.8% | 4.0% |
| Snow only | Mean | 1.10 | 3.83 | 0.50 | 2.10 |
| | SD/Mean | 1.3% | 1.3% | 2.7% | 3.1% |

Using only $CO_2$ snow cleaning, comparable yield of both small and large-area devices were obtained (FIG. 8). In contrast, using only solvent cleaning, all devices with area >0.64 cm$^2$ were shorted. Using PEDOT:PSS (Device B) and thicker $MoO_3$ (Device C) coatings on the ITO, the yields of 2.56 cm$^2$ devices were 50% and 67%, respectively. However, the thinner devices using snow-cleaned substrates had a higher yield (~70%). This indicates that $CO_2$ snow cleaning is considerably more effective in reducing surface contaminants than using either thick buffer layers or solvent cleaning alone. For both snow-plus-solvent cleaned (FIG. 7), and snow-cleaned-only substrates, the standard deviations of $V_{OC}$ and $J_{SC}$ from their mean values were ~1%. The standard deviation in fill factor was ~4.0% and was responsible for most of the variation in device efficiency. The spread in FF was caused by variations in dark current that arise from increased probability of encountering small particles in large-area devices, and variations in $R_SA$ (from 41 $\Omega\cdot$cm$^2$ to 69 $\Omega\cdot$cm$^2$) due to variations encountered while probing devices.

Snow cleaning of ITO-coated glass substrates is effective in the removal of contaminant particles, hence improving the yield of large-area OPV cells. Using snow cleaning, large-area devices exhibited a standard deviation of efficiency of ≤4.0% from the average. Further, the decrease of shunt resistance and increase of dark current due to particulates is evident when only conventional solvent substrate cleaning was employed. The existence of large particulates further resulted in the degradation of large-area device efficiency, fill factor, and yield. The relationship between FF and dark current was shown to be sensitive to the existence of shunt paths (and hence $R_pA$) caused by large particles. Furthermore, subelectrodes can reduce the series resistance, leading to a power efficiency of 2.21±0.05% of SubPc/$C_{60}$ device with an area of 6.25 cm$^2$; or approximately 82% that of an analogous device with an area of only 0.00785 cm$^2$.

What is claimed is:

1. A process for manufacturing a photovoltaic device comprising:

providing a substrate comprising a first electrode;

cleaning a surface of the substrate comprising the first electrode to remove particulates by a series of sequential sonication treatments followed by exposing the surface to a stream comprising $CO_2$ having one or more phases chosen from supercritical, gaseous, solid, and liquid phases;

depositing an organic active layer on the surface of the substrate comprising the first electrode; and providing a second electrode on the organic active layer;

wherein the organic active layer located between the first electrode and the second electrode has an active area ranging from about 0.5 cm$^2$ to about 50 cm$^2$; and wherein the organic active layer has a total thickness ranging from about 50 nm to about 80 nm.

2. The process of claim 1, wherein the thickness of the organic active layer is chosen to improve yield.

3. The process of claim 1, wherein the exposure is via flow of a directed stream of the $CO_2$.

4. The process of claim 1, wherein the cleaning is performed before loading the substrate into a deposition chamber.

5. The process of claim 1, wherein the cleaning is performed in a load lock of a deposition tool.

6. The process of claim 1, wherein the cleaning is performed in a deposition chamber.

7. The process of claim 1, wherein the active area ranges from about 1 $cm^2$ to about 10 $cm^2$.

8. The process of claim 7, wherein the active area ranges from about 2.56 $cm^2$ to about 6.25 $cm^2$.

9. The process of claim 1, wherein the substrate is an ITO-coated glass substrate.

10. The process of claim 9, wherein the cleaning decreases a root-mean-square roughness and a peak-to-valley roughness of the ITO-coated glass substrate.

11. A process for manufacturing a photovoltaic device comprising:

providing a first electrode layer;

cleaning the first electrode layer by a series of sequential sonication treatments followed by exposing the first electrode layer to a stream comprising $CO_2$ having one or more phases chosen from supercritical, gaseous, solid, and liquid phases;

providing a second electrode layer;

wherein an organic active layer is deposited between the first electrode layer and the second electrode layer;

wherein the organic active layer located between the first electrode and the second electrode has an active area ranging from about 0.5 $cm^2$ to about 50 $cm^2$;

wherein the organic active layer has a total thickness ranging from about 50 nm to about 80 nm;

wherein the cleaning increases yield without compromising efficiency; and wherein the cleaning reduces short circuits.

* * * * *